United States Patent [19]

Ohto et al.

[11] Patent Number: 5,337,286

[45] Date of Patent: Aug. 9, 1994

[54] SEMICONDUCTOR MEMORY DEVICE

[75] Inventors: Osamu Ohto; Tomoyuki Hamano; Eiji Kozuka; Naokazu Miyawaki, all of Yokohama, Japan

[73] Assignee: Kabushiki Kaisha Toshiba, Kawasaki, Japan

[21] Appl. No.: 993,854

[22] Filed: Dec. 21, 1992

[30] Foreign Application Priority Data

Dec. 26, 1991 [JP] Japan .................................. 345508
Aug. 5, 1992 [JP] Japan .................................. 209258

[51] Int. Cl.$^5$ ................................................ G11C 5/06
[52] U.S. Cl. ........................... 365/230.01; 365/230.03
[58] Field of Search ...................... 365/230.01, 230.03, 365/52, 63, 200; 371/49.1, 49.2

[56] References Cited

U.S. PATENT DOCUMENTS

| | | | |
|---|---|---|---|
| 4,433,388 | 2/1984 | Oosterbaan | 365/200 |
| 4,670,876 | 6/1987 | Kirk | 371/49.1 |
| 4,740,971 | 4/1988 | Tam et al. | 365/200 |
| 5,089,993 | 2/1992 | Neal et al. | 365/230.03 |
| 5,140,597 | 8/1992 | Araki | 371/49.1 |

Primary Examiner—Eugene R. LaRoche
Assistant Examiner—Vu Le
Attorney, Agent, or Firm—Foley & Lardner

[57] ABSTRACT

A semiconductor memory device is adapted for storing, as a unit of memory information, multiple-bit data constituted by signal data comprised of bit data of $2^n$ bits (n is a natural number) and remainder data comprised of bit data of C bits (C is a natural number, $C<2^n$). This semiconductor memory device includes a plurality of circuit blocks comprising, e.g., two memory cell groups each comprised of a plurality of memory cells, and a row decoder and a column decoder adapted for allowing respective desired ones of the memory cells within the memory cell groups to be selectively active. Thus, the row decoder and the column decoder become operative so that the bit data serving as the signal data is assigned to one or plural circuit blocks by one bit or plural bits, and the bit data serving as the remainder data is assigned to any circuit block in which bit assignment has been made.

8 Claims, 6 Drawing Sheets

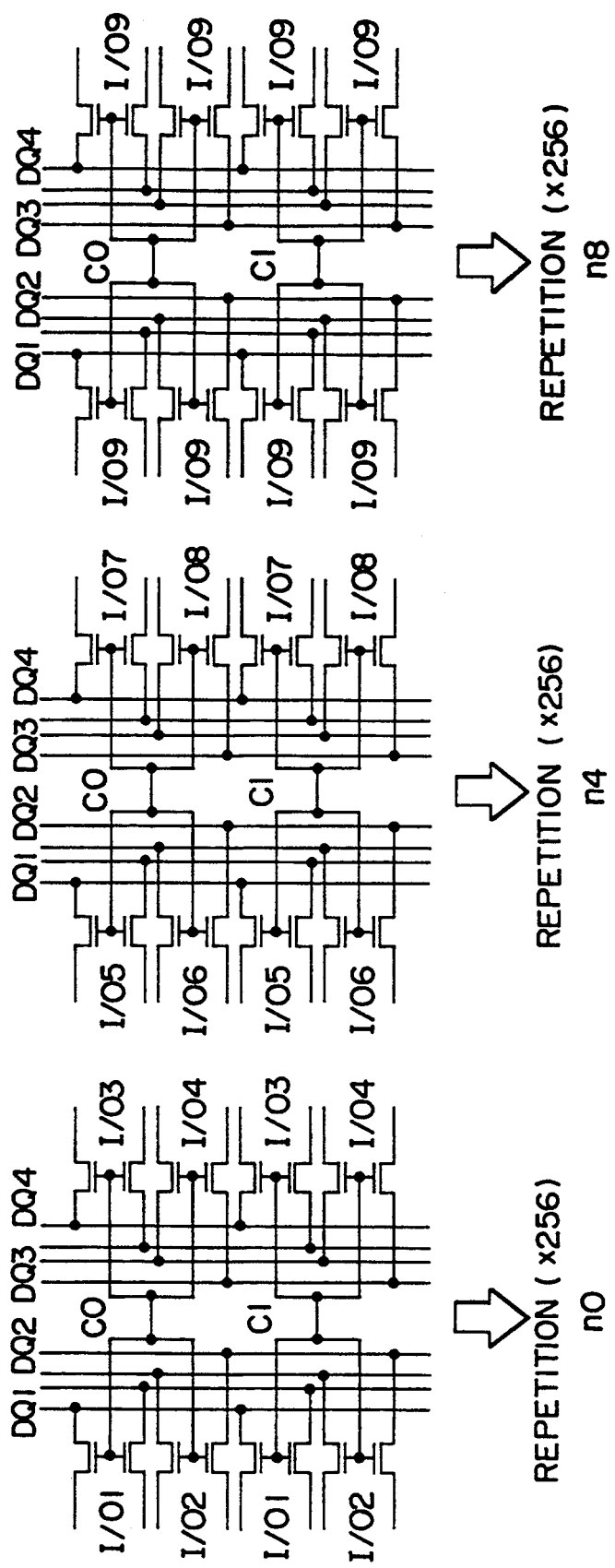

SEMICONDUCTOR MEMORY DEVICE

BACKGROUND OF THE INVENTION

This invention relates to a semiconductor memory device.

There is a tendency for semiconductor memory devices of high integration, large capacity and multi function to increase steadily year by year. Especially, such a tendency is conspicuous in DRAMs (Dynamic Random Access Memories).

Moreover, in recent years, there have appeared semiconductor memory devices in which the number of bits of memory information is not equal to $2^n$, e.g., semiconductor memory devices of 9 bits or 18 bits, etc. Among such semiconductor memory devices, there is known a semiconductor memory device in which 8 bits of, e.g., 9 bits are used as memory information (this memory information of 8 bits will be refered to as "signal data" hereinafter), and the remaining one bit is used for detection of error. This error detection is generally called a parity check, and data used for such a parity check is generally called parity data.

Explanation will now be given in connection with such conventional semiconductor memory devices by taking as an example a DRAM having an input/output circuit configuration of 512K×9 bits.

FIG. 7 is a block diagram conceptually showing the configuration of such a DRAM.

The DRAM shown in this figure includes, in total, nine basic circuit blocks ($n_0$–$n_8$ in the figure) called a circuit block In this DRAM, the core planes $n_0$–$n_7$ are used for storing signal data, and the circuit blocks $n_8$ is used for storing parity data.

The configuration of each of core planes $n_0$–$n_8$ is schematically shown in FIG. 8.

As shown in this figure, a column decoder 3 is arranged between two memory cell groups 4 and 5, and row decoders 1 and 2 are respectively arranged on the upper end sides of the memory cell groups 4 and 5. The memory cell groups 4 and 5 respectively include memory cells of 256K bits, and further includes 256 word lines $WL_0$–$WL_{255}$ and 1024 bit line pairs $BL_0$–$BL_{1023}$ in correspondence with respective memory cells.

Between the column decoder 3 and the memory cell groups 4 and 5, wiring or interconnecting regions 6 and 7 are provided. These wiring regions 6 and 7 respectively include wirings (not shown) connecting the column decoder 3 and the bit wiring pairs $BL_0$–$BL_{1023}$. Further, the wiring region 6 includes digit lines $DQ_1$ and $DQ_2$ for inputting/outputting data between the memory cell group 4 and the external. Similarly, the wiring region 7 includes digit lines $DQ_3$ and $DQ_4$ for inputting/outputting data between the memory cell group 5 and the external.

In carrying out data read or write operation with respect to the circuit blocks $n_0$–$n_8$ of such a configuration, the row decoder 1 and 2 first selects arbitrary word lines $WL_0$–$WL_{255}$, respectively. Simultaneously with this, the column decoder 3 selects two pairs at a time from the bit line pairs $BL_0$–$BL_{1023}$ with respect to respective memory cell groups 4 and 5.

Thus, data of 2 bits are read out from the memory cell group 4 or are written thereinto through digit lines $DQ_1$ and $DQ_2$ at the same time. Similarly, data of 2 bits are read out from the memory cell group 5 or are written thereinto through digit lines $DQ_3$ and $DQ_4$ at the same time. Namely, data of 4 bits are read out from one circuit block or are written thereinto at the same time.

As stated above, this DRAM is constructed so that respective circuit blocks carry out a read or write operation of 4 bit data at the same time by using four digit lines $DQ_1$–$DQ_4$.

In this instance, signal data of this DRAM is 8 bits as described above. Accordingly, two core planes are selected in carrying out a write operation of signal data, and write operations of signal data are carried out by 4 bits with respect to respective circuit blocks. Similarly, also in carrying out a read operation of signal data, two circuit blocks are selected, and read operations of signal data are carried out by 4 bits from respective circuit blocks.

The reason why a scheme is employed in which write or readout operations of signal data are respectively carried out by 4 bits with respect to two circuit blocks, in place of a scheme in which write or read operations of signal data, are carried out by 1 bit with respect to circuit blocks $n_0$–$n_7$ for signal data, is to lessen the number of circuit blocks used at the same time, to thereby reducing power consumption.

In this instance, 4 bits of the first half of signal data of 8 bits are collectively stored into one of the circuit blocks $n_0$–$n_3$. For this reason, as reference to FIG. 7 assists in understanding, input/output sections $IO_1$–$IO_4$ of nine input/output sections $IO_1$–$IO_9$ are connected to digit lines $DQ_1$–$DQ_4$ of the circuit blocks $n_0$–$n_3$, respectively. Similarly to the above, since 4 bits of the latter half are collectively stored into one of circuit blocks $n_4$–$n_7$, input/output sections $IO_5$–$IO_8$ are connected to digit lines $DQ_1$–$DQ_4$ of the core planes $n_4$–$n_7$, respectively. Further, since parity data are all stored into the circuit block $n_8$, the input/output section $IO_9$ for parity bits is always connected to any one of digit lines $DQ_1$–$DQ_4$ of the circuit block $n_8$. It is to be noted that, with respect to the input/output section $IO_9$, a decoder for digit line (not shown) is further required in order to select only one of digit line pairs $DQ_1$–$DQ_4$ of the circuit block $n_8$.

As stated above, the combination of circuit blocks selected by one write/readout operation is one of the combination of $n_0$, $n_4$ and $n_8$, the combination of $n_1$, $n_5$ and $n_8$, the combination of $n_2$, $n_6$ and $n_8$, and the combination of $n_3$, $n_7$ and $n_8$.

The wiring configuration of bit line pairs in the case where circuit blocks $n_0$, $n_4$ and $n_8$ are selected and are caused to be active is shown in FIGS. 9(a)-9(c).

With respect to the circuit blocks $n_0$ and $n_4$, arbitrary ones of output signals $C_0$–$C_{511}$ from the column decoder 3 are respectively turned ON, and two word lines WL are further selected. Thus, memory cells are respectively selected by 2 bits from the left and right memory cell groups 4 and 5. Between the selected memory cells and respective input/output sections $IO_1$–$IO_8$, transfer of signal data is carried out through digit line pairs $DQ_1$–$DQ_4$.

Further, in the circuit block $n_8$, only one digit line is selected by decoder for digit line (not shown) as described above. Accordingly, transfer of parity data is carried out with respect to only memory cell corresponding to the selected digit line of memory cells of 4 bits selected by four bit line pairs and two word lines.

However, such a conventional DRAM had the drawbacks described below.

(1) Since the conventional DRAM of this kind requires a circuit block $n_8$ exclusively used for parity data as described above, row decoders 1 and 2 and column decoder 3 exclusively used for this circuit block are required, thereby increasing chip size.

(2) Since the wiring length is elongated as a result of the fact that the chip size is increased as stated above, the wiring capacitance and/or the wiring resistance is also greatly increased, constituting the cause of delay in the operation of the chip.

(3) While an approach is employed to reduce power consumption by allowing circuit blocks $n_0$–$n_7$ for signal data to be basically operative, e.g., by only twos as described above, the circuit block $n_8$ for parity data must be operated at all times. Accordingly, even if an attempt is made to carry out a divisional operation to thereby reduce current consumption of the device, the existence of the circuit blocks $n_8$ exclusively used for parity data lessens the effect of such a reduction. Such a problem becomes more conspicuous as the capacity of DRAM the is increased.

(4) In addition, since the circuit block $n_8$ for parity data is different from the circuit blocks $n_0$–$n_7$ for signal data in the control method and the decoding method, a control circuit and/or a decode circuit which are exclusively used for the circuit block $n_8$ are required. For this reason, the system became complicated and costly.

SUMMARY OF THE INVENTION

Accordingly, an object of this invention is to provide a semiconductor memory device which has a high operation speed, is low in the current consumption, is simple in circuit configuration, and is inexpensive.

In accordance with this invention, there is provided a semiconductor memory device adapted for storing, as a unit of memory information, multiple-bit data constituted by signal data comprised of bit data of $2^n$ bits (where n is a natural number) and remainder data comprised of bit data of C bits (where C is a natural number, $C<2^n$), the semiconductor memory device including a plurality of circuit blocks comprising a memory cell group comprised of a plurality of memory cells, and a row decoder and a column decoder adapted for allowing a desired one of the memory cells within the memory cell group to be selectively active, the row decoder and the column decoder being adapted to become operative so that the bit data serving as the signal data is assigned to one or plural circuit blocks by one bit or plural bits, and the bit data serving as the remainder data is assigned to any circuit block in which bit assignment has been made.

In accordance with this invention, it is not necessary to provide a separate circuit block for remainder data, leading to down-sizing of chips, a in current consumption, shorter wiring length, and reduced cost.

Further, since it is unnecessary to provide a separate circuit block for remainder data in this way, there is also no need for a control circuit and/or a decoder for a circuit block used exclusively for remainder data. As a result, also in this respect, down-sizing of chips, reduction in current consumption, shortening of wiring length, and a reduction in cost are realized.

BRIEF DESCRIPTION OF THE DRAWINGS

In the accompanying drawings:

FIGS. 9(a)–9(c) are circuit diagrams showing a bit configuration of input/output sections of the circuit blocks shown in FIG. 7.

DESCRIPTION OF THE PREFERRED EMBODIMENTS

Preferred embodiments will now be described with reference to the attached drawings.

FIRST EMBODIMENT

Explanation will now be given in connection with the first embodiment by taking an example where this invention is applied to a DRAM.

The device according to this embodiment is characterized in that there is employed an arrangement in which bit data constituting parity data is assigned to any circuit block for signal data in place of providing a circuit block for parity data, to thus jointly use column decoder output signals.

Figure 1:
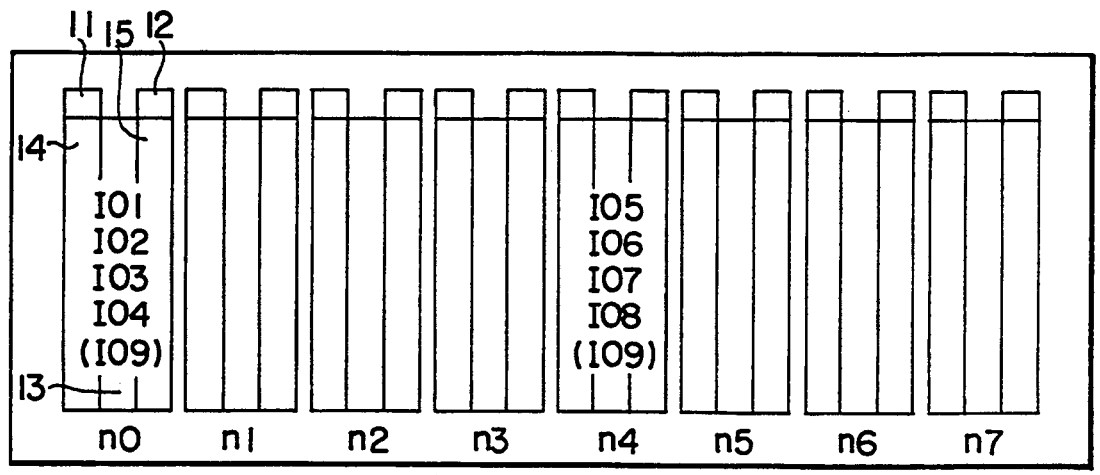
FIG. 1 is an arrangement diagram showing an arrangement of circuit blocks of a semiconductor memory device according to a first embodiment of this invention.
Figure 7:
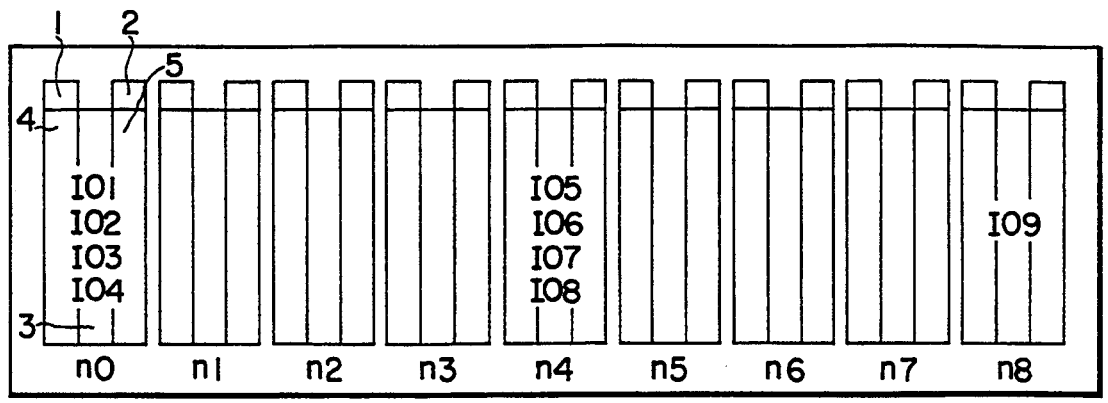
FIG. 7 is an arrangement diagram showing an arrangement of circuit blocks of a conventional semiconductor memory device.
Figure 8:
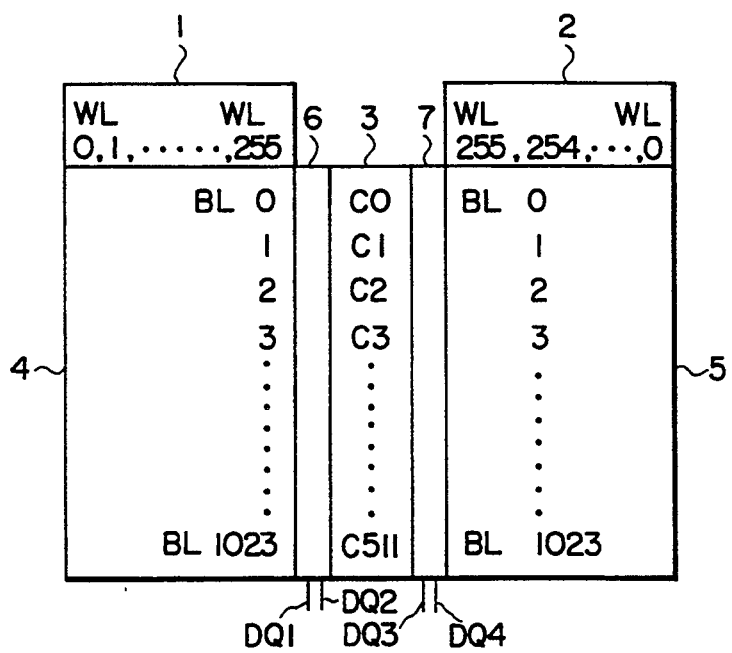
FIG. 8 is an explanatory view showing the configuration of the circuit blocks shown in FIG. 7.

The configuration of a DRAM according to this embodiment is shown in FIG. 1. The bit configuration of this DRAM is assumed to be 512K×9 bits as was the conventional DRAM which has been described with reference to FIG. 7. The number of bits of the input/output section to which data is inputted and from which data is outputted is equal to 9. In the case where the bit configuration is represented by $2^n+C$, n and C are equal to 3 and 1, respectively. Further, there are provided in total eight circuit blocks ($n_0$–$n_7$ in the figure). Parity data is assigned to any one of circuit blocks $n_0$–$n_7$.

Figure 2:
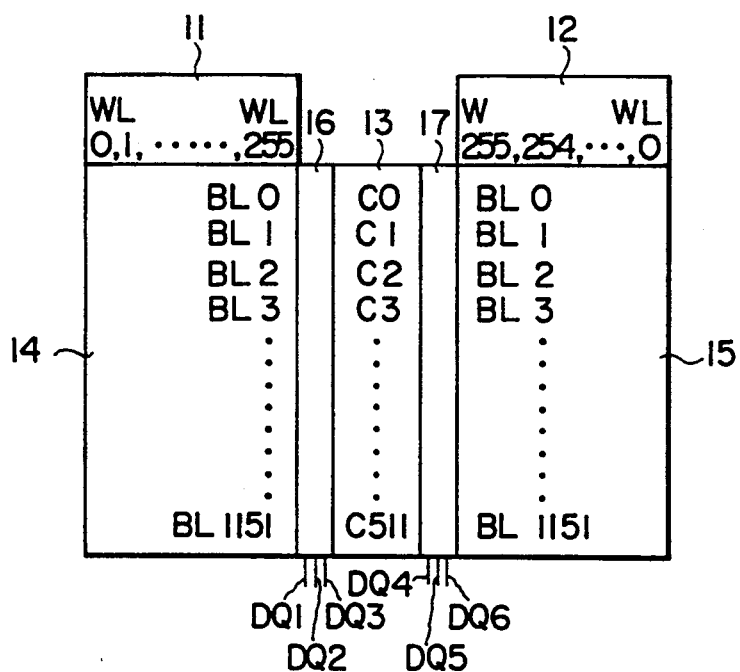
FIG. 2 is an explanatory view showing the configuration of the circuit blocks shown in FIG. 1.

Each of the circuit blocks $n_0$–$n_7$ has a configuration as shown in FIG. 2. Similarly to the conventional DRAM, memory cell groups 14 and 15 are arranged on the left and right hands of a column decoder 13, and row decoders 11 and 12 are arranged at the upper end sides of the memory cell groups 14 and 15, respectively. Between the memory cell groups 14 and 15 and the column decoder 13, there are respectively provided wiring or interconnecting regions 16 and 17 in which bit lines $BL_0$–$BL_{1151}$ are wired. In the wiring region 16, digit lines $DQ_1$–$DQ_3$ are wired. In the wiring region 17, digit lines $DQ_4$–$DQ_6$ are wired.

The memory cell groups 14 and 15 have a memory capacity of 288K bits. Namely, the respective memory capacities are increased by 32K bits (512K bits/16) more than that of the above-described conventional DRAM (see FIGS. 7–9(a)–(c)) because memory cells to which parity data is to be assigned are additionally required.

The number of word lines is 256 ($WL_0$-$WL_{255}$) similarly to that of the conventional device. Further, since the memory cell groups 14 and 15 respectively have a memory capacity greater than that of the abovedescribed DRAM by 32K bits, the number of bit line pairs is increased by 128 pairs, resulting in 1152 pairs ($BL_0$-$BL_{1151}$ in the figure). Respective three digit line pairs ($DQ_1$-$DQ_3$, $DQ_4$-$DQ_6$ in the figure) are provided in wiring regions 16 and 17 so that data can be inputted to the respective memory cell groups 14 and 15 and outputted therefrom by three bits.

The correspondence relationship between the circuit blocks $n_0$-$n_7$ and the input/output sections $IO_1$-$IO_9$ is as follows.

Four circuit blocks $n_0$-$n_3$ correspond to the input/output sections $IO_1$-$IO_4$ and $IO_9$, and the remaining four circuit blocks $n_4$-$n_7$ correspond to input/output sections $IO_5$-$IO_8$ and $IO_9$. The combination of circuit blocks caused to be active by one write/read operation is one of the combination of $n_0$ and $n_4$, the combination of $n_1$ and $n_5$, the combination of $n_2$ and $n_6$, and the combination of $n_3$ and $n_7$. Thus, circuit blocks of one-fourth of the entirety (two circuit blocks in this embodiment) are operative at all times as a whole of DRAM.

Figure 3:
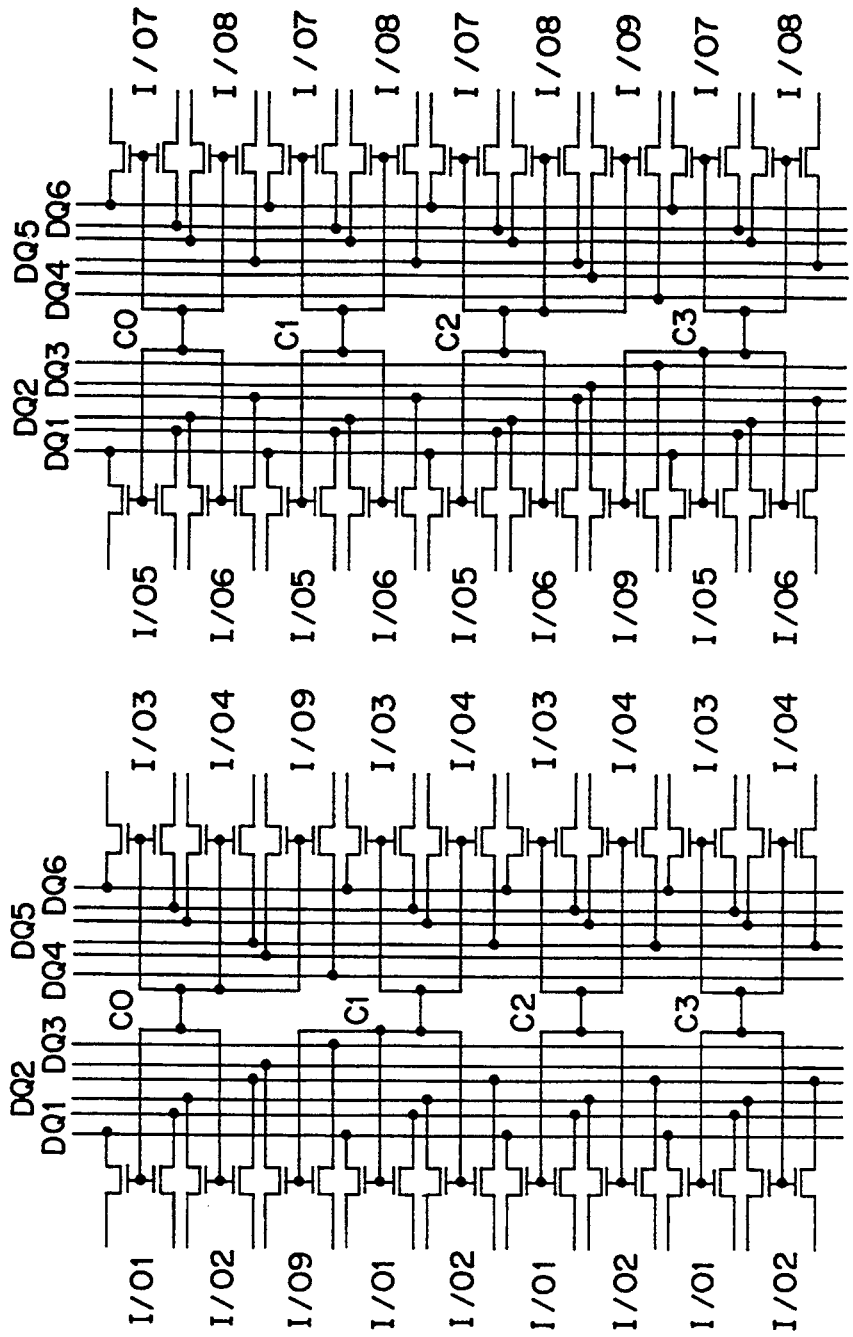
FIGS. 3(a)–3(b) are circuit diagrams showing a bit configuration of input/output sections of the circuit blocks shown in FIG. 1.

The configuration of every bit line pair when circuit blocks $n_0$ and $n_4$ are selected and are in an operating state is shown in FIGS. 3(a)-3(b). In the circuit blocks $n_0$, read/write operations of data corresponding to the input/output sections $IO_1$-$IO_4$ are carried out by any one of column address signals $C_0$, $C_1$, $C_2$, - - - . Further, read/write operations of data corresponding to the input/output sections $IO_5$-$IO_8$ are carried out by any one of column address signals $C_0$, $C_1$, $C_2$, - - - of the circuit block $n_4$. In addition, in either the circuit block $n_0$ or the circuit block $n_4$, a read/write operation of data corresponding to the input/output section $IO_9$ is carried out by one column address signal. Determination of a circuit block where an input/output operation of data of the input/output section $IO_9$ is carried out (i.e., either the circuit block $n_0$ or $n_4$) is made in dependency upon a column address signal.

The following advantages are provided with an embodiment having this structure. First, in the bit configuration of the input/output section represented by $2^n+C$, there is no necessity of providing a circuit block exclusively used for parity data. For this reason, a row decoder and column decoder for parity data become unnecessary, Thus, down-sizing of chips is realized, resulting in reduced cost.

Secondly, the wiring length is shortened by realization of down-sizing of chips, so the wiring capacitance and the wiring resistance can be reduced. Thus, the operation speed can be higher.

Thirdly, in this embodiment, since parity data is assigned to circuit blocks $n_0$-$n_7$ for signal data, it is possible to operate all circuit blocks in a divisional manner. In actual terms, in this embodiment, it is sufficient to operate circuit blocks of one-fourth of the entirety (i.e., two circuit blocks) in one read/write operation. Accordingly, this embodiment more advantageously reduces current consumption when compared to the case where the conventional device shown in FIG. 7 operates three circuit blocks.

Fourthly, a dedicated circuit for controlling a circuit block for parity data and/or a decoder which were required in the prior art are unnecessary. For this reason, the system is simplified and the cost is reduced. This contributes to an improvement in reliability.

SECOND EMBODIMENT

A second embodiment of this invention will now be described.

This embodiment differs from the above-described first embodiment in that memory cell groups of respective circuit blocks are divided into a region for assigning signal data and a region for assigning parity data.

Figure 4:
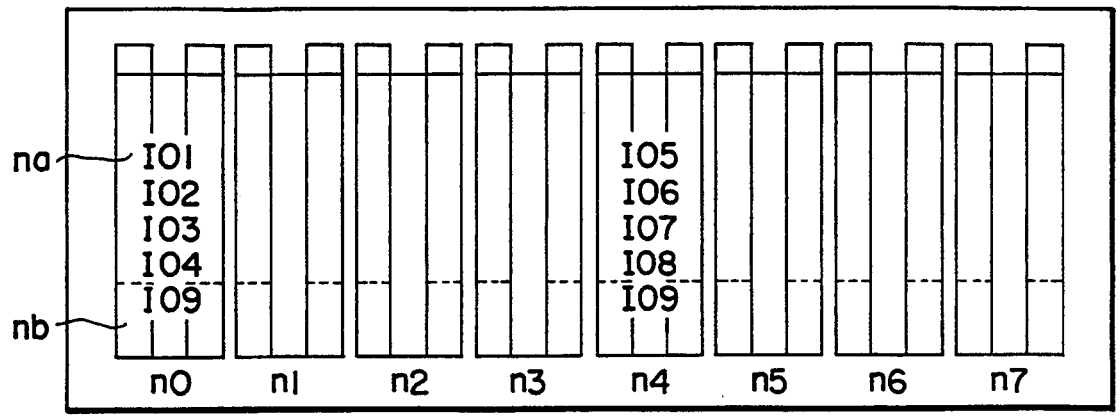
FIG. 4 is an arrangement diagram showing an arrangement of circuit blocks of a semiconductor memory device according to a second embodiment of this invention.

Namely, as shown in FIG. 4, memory cell groups 14 and 15 that respective circuit blocks $n_0$-$n_7$ have, are divided into a first memory cell region $n_a$ and a second memory cell region $n_b$. Thus, signal data is assigned to memory cells belonging to the first memory cell region $n_a$, and parity data is assigned to memory cells belonging to the second memory cell region $n_b$.

The bit configuration of the DRAM of this embodiment is also $512K \times 9$ bits as in the first embodiment. Further, this embodiment is the same as the first embodiment in that the number of bits of the input/output section is 9, and that the number of circuit blocks is 8 in total ($n_0$-$n_7$).

Figure 5:
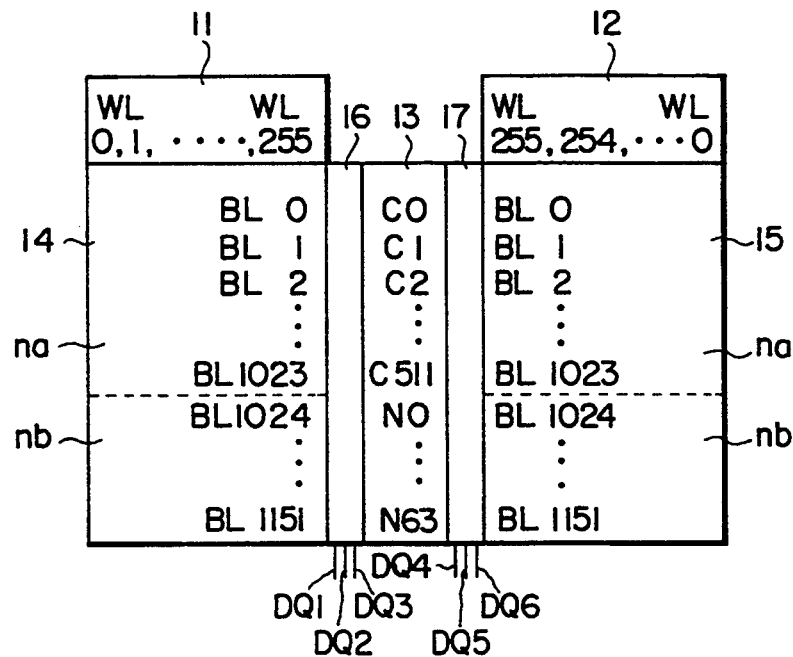
FIG. 5 is an explanatory view showing the configuration of the circuit blocks shown in FIG. 4.

Each of respective circuit blocks $n_0$-$n_7$ has a configuration as shown in FIG. 5. Similarly to the device of the first embodiment, memory cell groups 14 and 15 are arranged on the le#t and right sides of the column decoder 13, and row decoders 11 and 12 are arranged at the upper end sides of the memory cell groups 14 and Between the memory cell groups 14 and 15 and the column decoder 13, there are respectively provided wiring or interconnecting regions 16 and 17 where bit lines $BL_0$-$BL_{1151}$ are wired. In the wiring region 16, digit lines $DQ_1$-$DQ_3$ are wired. In the wiring region 17, digit lines $DQ_4$-$DQ_6$ are wired.

The memory cell groups 14 and 15 have 288K bits. Among them, 256K bits are allocated to memory cells for signal data, which constitute the first memory cell region $n_a$. Further, the remaining 32K bits are allocated to memory cells for a parity bit, which constitutes the second memory cell region $n_b$.

The number of word lines is 256 ($WL_0$-$WL_{255}$) as is the conventional device. Further, the number of bit line pairs is similarly 1152 ($BL_0$-$BL_{1151}$). The bit line pairs $BL_0$-$BL_{1023}$ thereof are connected to memory cells in the first memory cell region $n_a$, and the remaining bit line pairs $BL_{1024}$-$BL_{1151}$ are connected to memory cells in the second memory cell region $n_b$. Digit line pairs ($DQ_1$-$DQ_3$, $DQ_4$-$DQ_6$) are respectively provided by three pairs in wiring regions 16 and 17 in a similar manner to the first embodiment.

The correspondence relationship between circuit blocks $n_0$-$n_7$ and input output sections $IO_1$-$IO_9$ is as follows.

In these four circuit blocks $n_0$-$n_3$, the first memory cell region $n_a$ corresponds to input/output sections $IO_1$-$IO_4$, and the second memory cell region $n_b$ corresponds to the input/output section $IO_9$. Further, in the remaining four core planes $n_4$-$n_7$, the first memory cell region $n_a$ corresponds to the input/output sections $IO_5$-$IO_8$, and the second memory cell region $n_b$ corresponds to the input/output section $IO_9$. The combination of circuit blocks caused to be active by one write/read operation is one of the combination of $n_0$ and $n_4$, the combination of $n_1$ and $n_5$, the combination of $n_2$ and $n_6$, and the combination of $n_3$ and $n_7$. Thus, circuit blocks of one-fourth of the entirety (i.e., two circuit blocks) become operative at all times as a whole of DRAM.

Figures 6A, 6B:
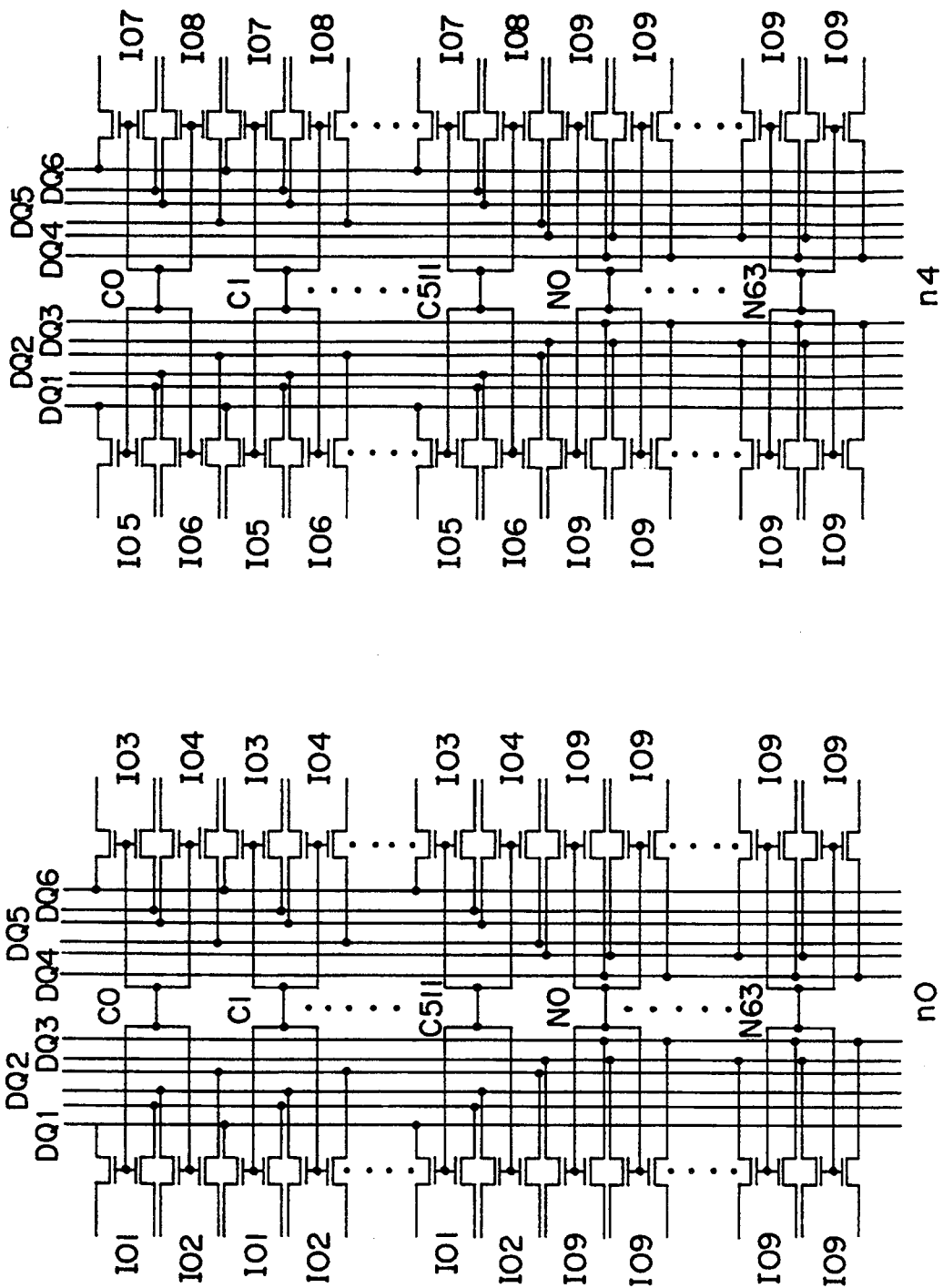
FIGS. 6(a)–6(b) are circuit diagrams showing a bit configuration of input/output sections of the circuit blocks shown in FIG. 4.

The configuration of every bit line pair when the circuit blocks $n_0$ and $n_4$ are selected and are placed in an operating state is shown in FIGS. 6(a)–6(b). In the circuit block $n_0$, read/write operations of data corresponding to the input/output sections $IO_1$–$IO_4$ are carried out by any one of column address signals $C_0$, $C_1$, $C_2$, ---, $C_{511}$. Further, read/write operations of data corresponding to the input/output sections $IO_5$–$IO_8$ are carried out by any one of column address signals $C_0$, $C_1$, $C_2$, ---, $C_{511}$ of the circuit block $n_4$. In addition, in either the core plane $n_0$ or the circuit block $n_4$, a read/write operation of data corresponding to the input/output section $IO_9$ is carried out by any one of column address signals $N_0$, $N_1$, ---, $N_{63}$. Determination of a circuit block where an input/output operation of data of the input/output section $IO_9$ is carried out (either the circuit block $n_0$ or $n_4$) is made in dependency upon a column address signal.

Also with such a configuration, advantages similar to those with the above-described first embodiment can be provided.

It is to be noted that the embodiments which have been described are presented only for illustrative purpose, and do not limit this invention in any sense. The devices in the first and second embodiments correspond to the case where the input/output section has a 9 bit configuration (n=3, C=1). However, even if the input/output section has other bit configurations, this invention may be similarly applied thereto. For example, in the case where the input/output section has an 18 bits configuration, n and C are respectively equal to 4 and 2, and parity data has 2 bits. In this instance, an approach may be employed to supplement memory cells of 2 bits to all circuit blocks corresponding to the input/output section represented by $2^4$ to carry out an input/output operation of 2 bits to and from any one circuit block. Alternatively, an approach may be employed to supplement memory cells each comprised of one bit to respective circuit blocks to select two to carry out an input/output operation of parity data of 2 bits.

While circuit blocks are caused to be operated in a divisional manner in the above-described first and second embodiments, they may be caused to be operated at all times. For example, in the case of carrying out data of 9 bits, there may be employed a configuration in which two circuit blocks are provided to carry out an input/output operation of data of 4 bits of signal data with respect to any one circuit block and to carry out an input/output operation of data of 4 bits of signal data and 1 bit of parity data with respect to the other circuit block.

In addition, it is not necessarily required that memory cell groups are arranged in the state where they are divided into two sections on the left and right sides of the column decoder, but there may be employed a configuration in which such memory cell groups are integral, or an arrangement in which such memory cell groups are divided into three sections or more.

What is claimed is:

1. A semiconductor memory device adapted for storing, as a unit of memory information, multiple-bit data constituted by signal data and remainder data, the signal data consisting of bit data of $2^n$ bits and the remainder data consisting of bit data of C bits (where C is a natural number, $C<2^n$), said semiconductor memory device comprising a plurality of circuit blocks including a memory cell group having a plurality of memory cells, and a row decoder and a column decoder adapted for allowing desired memory cells within the memory cell group to be selectively active, said row decoder and said column decoder being adapted to become operative so that the bit data serving as the signal data is assigned to at least one circuit block by plural bits, and the bit data serving as the remainder data is assigned to any circuit block in which bit assignment has been made.

2. A semiconductor memory device as set forth in claim 1, wherein each of said circuit blocks includes a first memory cell group and a second memory cell group, and said column decoder is adapted to select bit lines different from each other in number with respect to said first memory cell group and said second memory cell group.

3. A semiconductor memory device as set forth in claim 1,
wherein said memory cell group is divided into a first memory cell region and a second memory cell region, and
wherein said row decoder and said column decoder is adapted to become operative so that said signal data are assigned to the memory cells belonging to said first memory cell region, and said remainder data is assigned to the memory cells belonging to said second memory cell region.

4. A semiconductor memory device as set forth in claim 2,
wherein said respective memory cell groups are divided into a first memory cell region and a second memory cell region, and
wherein said row decoder and said column decoder are adapted to become operative so that said signal data is assigned to the memory cells belonging to said first memory cell region, and said remainder data is assigned to the memory cells belonging to said second memory cell region.

5. A semiconductor memory device adapted for storing, as a unit of memory information, multiple bit data constituted by signal data consisting of bit data of $2^n$ bits (where n is a natural number) and remainder data consisting of bit data of C bits (where C is a natural number), said semiconductor memory device comprising:
a semiconductor substrate;
a plurality of circuit blocks formed on said substrate, each having first and second memory cell groups, a row decoder and a column decoder, an interconnecting region between said first and second memory cell groups, and said row decoder and column decoder, and a plurality of digit lines leading from said interconnecting region;
wherein said row decoders and said column decoders are adapted to assign signal data to at least one circuit block and parity data to any circuit blocks in which bit assignment has been made.

6. A semiconductor memory device as set forth in claim 5, wherein at least two circuit blocks are operative at all times, each memory cell group is interconnected to three digit lines, and during each read/write operation, two digit lines are used to transmit signal data and a third digit line is used to transmit parity data.

7. A semiconductor memory device as set forth in claim 6, wherein said respective memory cell groups are divided into a first memory cell region and a second memory cell region, and each of said third digit lines is interconnected to a second memory cell region of a respective memory cell group.

8. A semiconductor memory device as set forth in claim 7, wherein said semiconductor memory device is a dynamic random access memory device.

* * * * *